United States Patent
Call et al.

[11] Patent Number: 5,471,027
[45] Date of Patent: Nov. 28, 1995

[54] METHOD FOR FORMING CHIP CARRIER WITH A SINGLE PROTECTIVE ENCAPSULANT

[75] Inventors: Anson J. Call, Holmes; Stephen H. Meisner, Hudson; Frank L. Pompeo, Walden; Jeffrey A. Zitz, Poughkeepsie, all of N.Y.

[73] Assignee: International Business Machines Corporation, Armonk, N.Y.

[21] Appl. No.: 279,606

[22] Filed: Jul. 22, 1994

[51] Int. Cl.⁶ .............................. B23K 1/00; H01L 21/56
[52] U.S. Cl. .................. 219/85.13; 437/211; 437/902; 29/841; 29/855
[58] Field of Search .................................. 257/706–707, 257/712–713; 437/209, 211, 219, 902; 228/179.1, 180.1, 180.21, 180.22; 361/760–764, 704, 709, 711, 715, 722; 29/832, 841, 846, 854–856; 219/85.13, 91.2, 85.22

[56] References Cited

U.S. PATENT DOCUMENTS

| | | |
|---|---|---|
| 4,069,498 | 1/1978 | Joshi . |
| 4,561,011 | 12/1985 | Kohara et al. . |
| 4,908,696 | 3/1990 | Ishihara et al. . |
| 4,999,699 | 3/1991 | Christie et al. . |
| 5,244,142 | 9/1993 | Nishiguchi et al. ............... 228/180.22 |

OTHER PUBLICATIONS

Research Disclosure, No. 270, Publication No. 27014, (Oct. 1986), entitled "Stick–On Heat Sink".

*Primary Examiner*—Bot L. Ledynh
*Attorney, Agent, or Firm*—Aziz M. Ahsan

[57] ABSTRACT

The present invention relates generally to a new apparatus and method for a chip carrier. More particularly, the invention encompasses an apparatus and a method that uses a chip carrier having a single encapsulant to provide both flip chip fatigue life enhancement and environmental protection. A double-sided, pressure-sensitive, thermally-conductive adhesive tape could also be used with the encapsulated chip to directly attach the chip to a heat sink. Similarly, also disclosed is a method and apparatus for directly joining a heat sink to the chip carrier.

17 Claims, 2 Drawing Sheets

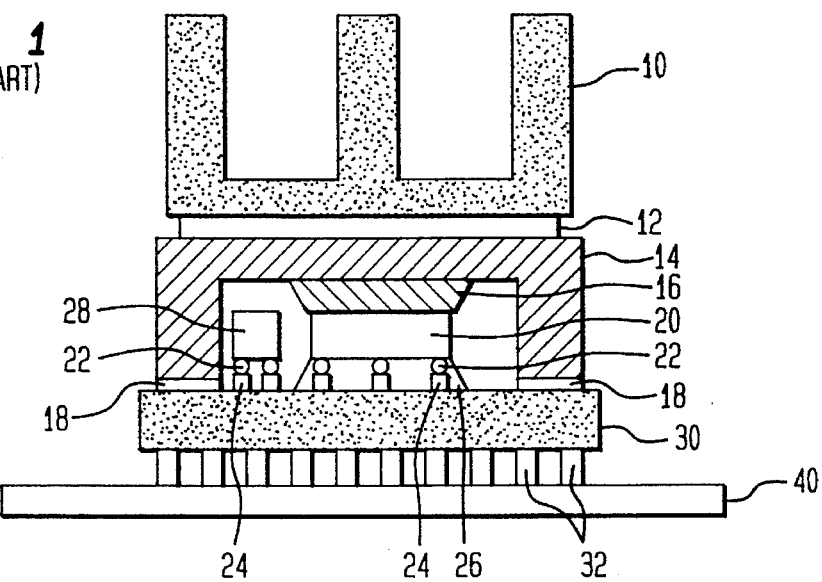
FIG. 1
(PRIOR ART)
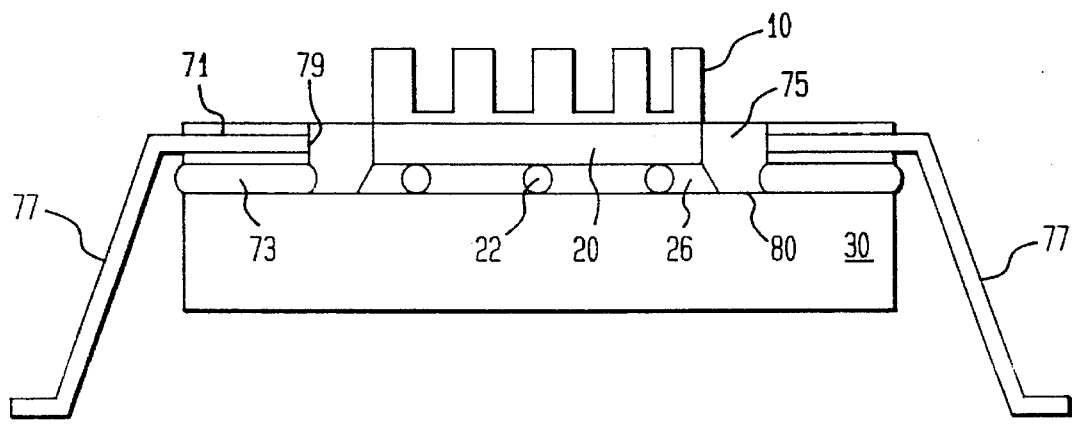
FIG. 2
(PRIOR ART)
FIG. 3
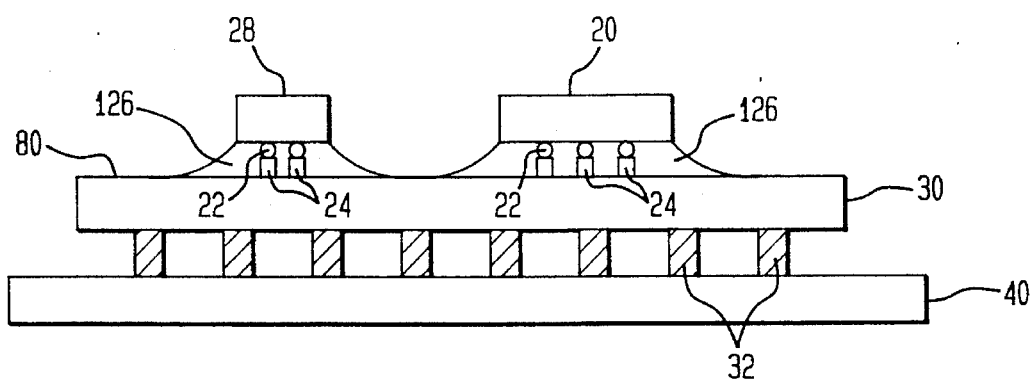

METHOD FOR FORMING CHIP CARRIER WITH A SINGLE PROTECTIVE ENCAPSULANT

CROSS-REFERENCE

This Patent Application is related to U.S. Pat. application Ser. No. 08/279,734, entitled "METHOD AND APPARATUS FOR DIRECTLY JOINING A CHIP TO A HEAT SINK", assigned to the assignee of the instant Patent Application, and the disclosure of which is incorporated herein by reference.

FIELD OF THE INVENTION

The present invention relates generally to a new apparatus and method for a chip carrier. More particularly, the invention encompasses an apparatus and a method that uses a chip carrier having a single encapsulant to provide both flip chip fatigue life enhancement and environmental protection. A double-sided, pressure-sensitive, thermally-conductive adhesive tape could also be used with the encapsulated chip to directly attach the chip to a heat sink. Similarly, also disclosed is a method and apparatus for directly joining a heat sink to the chip carrier.

BACKGROUND OF THE INVENTION

Semiconductor devices are becoming smaller and more dense with the evolution of new technology. However, increases in circuit density produce a corresponding increase in overall chip packaging strategies in order to remain competitive. Chip and chip carrier manufacturers are therefore constantly being challenged to improve the quality of their products by identifying and eliminating problems, reducing package size and weight, decreasing package costs, providing improved thermal efficiencies and better and more advanced chips. Whereas significant improvements are being made to eliminate systematic problem by reducing process variability. Process improvements alone are not sufficient to eliminate all the problems which effect both performance and reliability.

One way to increase performance and reliability would be to apply new materials to obtain chip fatigue life enhancement and/or to provide new environmental protection to the chip and/or the chip carrier or substrate. These advancements in the chip and chip carrier art have a profound effect on this industry.

Another way to increase performance and reliability is to provide the shortest and most efficient thermal cooling path for the integrated circuit chips. This could be done by bringing the chip physically as close as possible to the heat sink. Another way would be to provide more efficient cooling of the chip. However, when the chips are brought closer to the heat sink, means also have to be provided to securely provide a thermal contact between the chip and the heat sink. In some cases thermally conductive epoxies have been used to provide a better thermal contact between the chip and the heat sink, and in others some sort of thermal type paste has been used.

Research Disclosure, No. 270, Publication No. 27014 (October 1986), the disclosure of which is incorporated herein by reference, discloses a stick-on heat sink. A heat sink is attached to a module by sliding the module into the heat sink and where the edges of the heat sink snap close to secure the heat sink to the module. It is also disclosed that an adhesive or double sided tape could also be placed on the bottom surface of the heat sink to assure intimate contact between the module and the heat sink.

U.S. Pat. No. 4,092,697 (Spaight), the disclosure of which is incorporated herein by reference, discloses placing a film of thermally conductive material between the chip and the heat sink or heat radiator.

U.S. Pat. No. 4,233,645 (Balderes et al.), discloses placing a block of porous material which is impregnated with a suitable liquid between the chip and the heat sink to provide a thermally conductive path.

U.S. Pat. No. 4,849,856 (Funari et al.), the disclosure of which is incorporated herein by reference, discloses a direct chip to heat sink attachment process where a thermally conductive adhesive is used to directly secure the heat sink to the chip.

U.S. Pat. No. 4,939,570 (Bickford et al.), the disclosure of which is incorporated herein by reference, discloses another direct chip to heat sink attachment process where a thermally conductive adhesive is used to directly secure the heat sink to the chip.

U.S. Pat. No. 4,999,699 (Christie, et al.), the disclosure of which is incorporated herein by reference, discloses solder interconnection whereby the gap created by solder connections between a carrier substrate and semiconductor device is filled with a composition obtained from curing a preparation containing a cycloaliphatic polyepoxide and/or curable cyanate ester or prepolymer thereof; filler having a maximum particle size of 31 microns and being at least substantially free of alpha particle emissions.

U.S. Pat. No. 5,249,101 (Frey, et al.), the disclosure of which is incorporated herein by reference, discloses a coverless chip carrier which uses at least two encapsulants. The first encapsulant is used to provide flip-chip fatigue life enhancement. The second encapsulant is used to provide limited environmental protection. A third encapsulant is also required for carriers using peripheral leads to contain the second encapsulant prior to curing. Also disclosed is that the encapsulant have a CTE (Coefficient of Thermal Expansion) which is within 30 percent of the CTE of the solder balls.

The inventors of this invention, however, are using an entirely different approach to solve this age old problem of chip carrier cost, weight, and size. They have discovered that a single specific encapsulant material can be used to provide the full environmental protection, including solvent exposure, and fatigue enhancement.

With this single encapsulant one could also use a double-sided, pressure-sensitive, thermally-conductive adhesive tape to directly attach the chip to the heat sink and to provide a secure thermal contact between the two.

Furthermore, they have also discovered a novel method and structure which ensures the integrity of the bond between the heat sink and the substrate, while the chip connections and other features are protected by the novel encapsulant.

The structure and process of this invention offers several advantages over the prior art. For example, it provides a simplified modular construction, therefore, it utilizes fewer materials and process steps for assembly, and allows ease of workability or repair of the assembled module.

PURPOSES AND SUMMARY OF THE INVENTION

The invention is a novel method and apparatus for a chip carrier having a single encapsulant to provide both flip chip fatigue life enhancement and environmental protection. The invention also encompasses a novel apparatus and method for direct attachment of a heat sink to a chip and/or a substrate.

Therefore, one purpose of this invention is to provide an apparatus and method that will provide a coverless chip carrier of simplified construction.

Another purpose of this invention is to increase the available area on the chip carrier or substrate for joining of active devices, such as, chips, and passive devices, such as, decoupling capacitors, etc.

Yet another purpose of this invention is to provide suitable environmental protection against solvent exposure to the chip carrier.

Still yet another purpose of this invention is to provide an apparatus and a method that will provide a direct thermal path using a double-sided, thermally-conductive, pressure-sensitive adhesive tape between a chip a heat sink.

Another purpose of this invention is to provide a double-sided, thermally-conductive, pressure-sensitive, adhesive tape between a chip and a heat sink to ensure a secure thermal contact between the two.

Still another purpose of this invention is to have a very economical and efficient thermally conductive path between a chip and a heat sink.

Still yet another purpose of the invention is to provide a method and apparatus for ensuring the integrity of the bond between the chip and the heat sink.

Yet another purpose of this invention is the ability to rework or repair the completed or assembled module.

Therefore, in one aspect this invention comprises a method for forming a chip carrier having a single encapsulant, comprising:

(a) electrically connecting at least one chip to a first surface of a substrate, (b) applying an encapsulant precursor to at least a portion of said electrical connection and to at least a portion of said first surface of said substrate, (c) heating said encapsulant precursor to a temperature of about 70° C., ±10° C., for a minimum of about 5 minutes and a maximum of about 15 minutes, until said encapsulant precursor has transformed into a gel, (d) heating said encapsulant gel for a minimum of about 1 hour and a maximum of about 2 hours, at a temperature of about 70° C., ±10° C., (e) hardening said encapsulant gel at a temperature of between about 130° C., ±10° C., and about 160° C., ±10° C., for a minimum of about 4 hours and a maximum of about 6 hours, (f) cooling said hardened encapsulant until said hardened encapsulant has reached room temperature, and thereby forming said chip carrier having a single encapsulant.

In another aspect this invention comprises a chip carrier having a single encapsulant, comprising (a) a substrate having a first surface and a second surface, (b) at least one chip electrically connected via at least one solder ball to said first surface of said substrate, (c) an encapsulant encapsulating said at least one solder ball and at least a portion of said first surface of said substrate, wherein said encapsulant comprises of a mixture of cycloaliphatic epoxide, hexahydrophthalic anhydride, benzyl dimethyl amine, silica filler and ethylene glycol, and thereby forming said chip carrier having a single encapsulant.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1, illustrates one prior art scheme to connect a chip to a heat sink and a substrate.

FIG. 2, illustrates another prior art scheme to connect a chip to a heat sink and a substrate.

FIG. 3, illustrates a preferred embodiment of this invention.

DETAILED DESCRIPTION OF THE INVENTION

Figure 4:
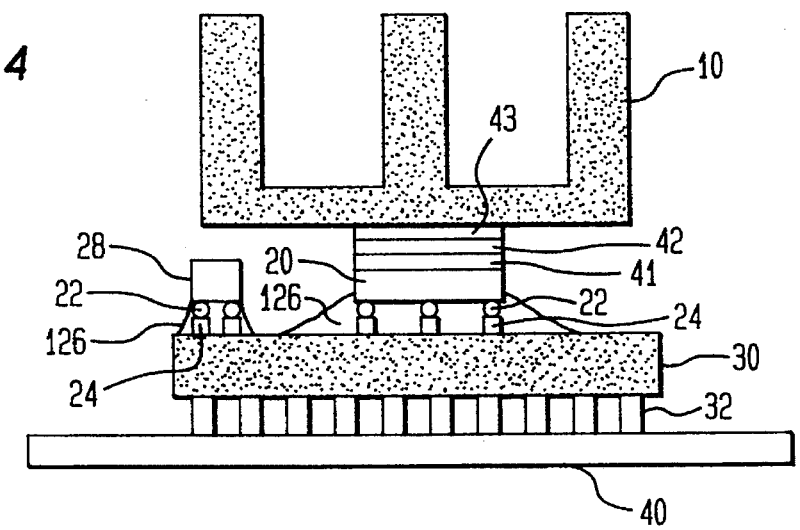
FIG. 4, illustrates another preferred embodiment of this invention.

IBM's multilayered ceramic (MLC) electronic packages are among the most technically advanced electronic packages in the industry: however, they are also very expensive. This invention describes one way to reduce cost of such packages without any loss or degradation of their performance. Packaging methods which reduces cost advantageously increases the availability of such electronic packages in the marketplace. As a person skilled in the art knows that increased packaging density is typically achieved by greater utilization of the real estate of the substrate or module.

FIG. 1, illustrates one prior art scheme to connect a chip 20, to a heat sink 10. Typically, the chip 20, is first secured to a substrate or module 30, via a plurality of solder balls 22, on pads 24, that are on the substrate or module 30. The substrate 30, could also have one or more electronic device(s) 28, such as, for example, a decoupling capacitor 28, that is also electrically connected to the substrate 30, via the pads 24, and solder balls 22. For some applications the solder balls 22, and pads 24, could be encapsulated with an encapsulant 26. A thermally conductive material 16, is usually applied over the exposed surface of the chip 20, such that a direct thermal contact is made between the chip 20, and the cap or cover 14, when the cover 14, is placed over to cover the chip 20. A cap sealant 18; is typically provided, in order to secure the cap or cover 14, to the substrate or module 30. The heat sink 10, can now be secured to the cap or cover 14, using a heat sink adhesive 12. The substrate 30, is typically secured to a mother board or card 40, via I/O (Input/Output) means 32, such as, for example, pads, pins, etc.

The cap or cover 14, is typically a metallic or ceramic cap, that is placed over the chip 20, and is permanently secured to the surface of the substrate 30. This is done primarily to prevent mechanical and chemical injury to the chip 20, solder balls 22, decoupling capacitors 28, encapsulant 26 and any exposed metallurgy or circuitry on the substrate 30. It is well known that a leak in the cap 14, or in the cap sealant 18, or any misalignment of the cap 14, may result in irrecoverable module yield losses. These losses could be substantial for an expensive module. A picture-frame type area on the top surface of the substrate 30, is required to specifically seal the cap 14, to the substrate 30, using the cap sealant 18. This frame type surface could be between about 2 mm and about 6 mm wide. Therefore, the placement of all devices, such as, for example, chips 20, decoupling capacitors 28, is restricted to be within this picture frame area, which is typically only between about 50 percent and about 70 percent, of the area that would otherwise be available for additional or larger devices. Additionally, the cap or cover 14, typically adds between about 30 percent and about 50 percent, to the overall height of the module. Thermal compound 16, must be placed between the chip 20, and the cap 14, to provide an efficient heat transfer path via the heat sink adhesive 12, to the heat sink 10. Furthermore, the presence of the cap or cover 14, adds additional weight to the completed or assembled module.

FIG. 2, illustrates another prior art scheme to connect a chip 20, to a heat sink 10, and a substrate 30. The chip 20, is first electrically connected to the substrate 30, via at least one solder ball 22. A portion of the chip 20, is then encapsulated with a first encapsulant 26, and then with a second encapsulant 75. In order to ensure that the second encapsulant 75, does not run over the edges of the substrate 30, one could have a dam comprising of material 73, such as, electrical contact pads 73.

The substrate 30, could be an alumina substrate, or a ceramic substrate or a plastic substrate. The substrate 30, typically also has a circuitized surface 80, which includes circuit lines (not shown) and electrical contact pads 73.

The solder balls 22, are typically encapsulated with an encapsulant 26, having a TCE (Thermal Coefficient of Expansion) which is within 30 percent of the TCE of the solder balls 26. The composition of the solder ball encapsulant 26, includes, for example, an epoxy binder, e.g., a cycloaliphatic polyepoxide binder, and a filler, e.g., high purity fused or amorphous silica, such as disclosed in U.S. Pat. No. 4,999,699. The chip carrier 30, also includes a metallic lead frame or edge clip 77, which are mechanically and electrically connected to the contact pads 73. The edge clips 77, are typically connected to the contact pads 73, through the use of solder 79. In addition, each solder connection between the contact pad 73, and the lead frame or edge clip 77, is at least partially, and preferably totally, encapsulated with a material 71.

With the exception of the contact pads 73, at least a portion, and preferably all, of the circuitry on the circuitized surface 80, exterior to the encapsulated solder balls 22, are covered by, and thereby encapsulated in a coating 75. The coating 75, serves to protect the covered circuitry from mechanical and environmental hazards. This coating 75, also contacts, and at least partially encircles, the first encapsulant 26, encapsulating the solder balls 22.

The composition used to form the coating 75, is dispensed onto the circuitized surface 80, typically using a syringe, and it readily flows over this surface to cover the exposed circuitry after being dispensed. This flow is mostly due to the influence of capillary action, which readily flows up the sides of the solder ball encapsulant 26, to cover and encircle this encapsulant 26. In addition, this composition is thereafter relatively quickly and conveniently cured using UV radiation.

If, however, no coating of the material 75, is formed on the upper surface of the chip 20, then a heat sink 10, is readily directly mounted on the upper surface of the chip 20.

As shown in FIG. 2, the electrical connection from the module or substrate 30, to the card or mother board 40 (not shown), is provided via I/O means 77, such as, for example, electrically conducive clips 77.

FIG. 3, illustrates a preferred embodiment of this invention. One way to reduce chip carrier cost, size, and weight is to use one material for both environmental protection and fatigue life enhancement of the chip. This can be done by using an under-chip encapsulant 126, and thus eliminating the chip cover. Elimination of the chip cover leaves all devices on the chip carrier 30, exposed to the environment, including module and card assembly process environments, as well as customer use environments. Assembly process environments may include exposure to solvents such as xylene, alcohols, terpenes, oils, etc. Customer use environments may expose the package or module to ambient temperature changes, humidity, etc. In prior coverless chip carriers, such as the one shown in FIG. 2, a second encapsulant 75, has been used to provide the environmental protection necessary in a customer environment. However, this second encapsulant 75, does not protect against solvent exposures, such as xylene, which are part of some assembly environments.

FIG. 3, which illustrates the preferred embodiment of this invention, is the basic form of the chip carrier 30, without a heat sink installed. Typically the chip 20, is first secured to a substrate or chip carrier 30, via a plurality of solder balls 22, on pads 24, that are on the substrate 30. The substrate 30, could also have one or more electronic devices 28, such as, for example a decoupling capacitor 28, that is also electrically connected to the substrate 30, via the pads 24, and solder balls 22. The solder balls 22, and the pads 24, are encapsulated with a single inventive encapsulant 126, which is cured in a two stage process in order to achieve full environmental protection of the chip 20, solder balls 22, pads 24, and other circuitry that may be on the surface 80, of the substrate 30.

A preferred encapsulant 126, is EPX5341, which is a trademark of IBM Corporation, Armonk, N.Y., U.S.A., and which is manufactured under a license by Polyset Company Incorporated, Mechanicville, N.Y., U.S.A. A specific two stage cure process, consisting of a gel stage and a hardening stage are required to achieve full environmental protection and specifically solvent exposure resistance. A gel stage within a specific temperature range is required to assure that the hexahydrophthalic anhydride (H.A.) has initiated sufficient crosslinking while preventing premature volitization of the H.A., thus ensuring stoichiometric reaction kinetics. A non-stoichiometric reaction results in a material with an undesirable chemical structure, vulnerable to chemical attack by solvents, i.e., xylene, etc. Following the prescribed gel process, final curing of the epoxy is achieved by hardening at temperatures between about 130° C., ±10° C., and about 160° C., ± 10° C., for a minimum of about 4 hours and a maximum of about 6 hours. Thus, this specific gel/hardening process modifies the chemical structure of the finished material, providing full environmental protection against solvent exposure while maintaining the intended fatigue enhancement qualities. It should be noted that solvent exposure is necessary in some assembly operations, and therefore, there is a definite need for an encapsulant to protect the sensitive features of an electronic module. The encapsulant 126, also protects the chip 20, solder balls 22, pads 24, and other features on the surface of the chip carrier 30, from subsequent exposures to the ambient in a machine or computer operating environment.

The encapsulant precursor 126, basically comprises of a mixture of cycloaliphatic epoxide, hexahydrophthalic anhydride, benzyl dimethyl amine, silica filler and ethylene glycol.

The mixture for the encapsulant precursor 126, preferably contains about 22.0 weight percent cycloaliphatic epoxide, about 22.0 weight percent hexahyrophthalic anhydride, about 0.2 weight percent benzyl dimethyl amine, about 56.0 weight percent silica filler and about 0.4 weight percent ethylene glycol.

The preferred steps to apply the encapsulant precursor 126, onto the solder balls or connections 22 and the other surface features on the chip carrier 30, include:

(a) thawing the encapsulant precursor 126, at a temperature of about 25° C., ±3° C., for a minimum of about 1 hour, and a maximum of 8 hours, (b) dispensing the encapsulant precursor 126, on the desired areas, such as, between and around the solder balls or connections using a syringe, at a temperature of about 25° C., ±3° C., (c) heating the encapsulant precursor 126, and the associated features, such as, the chip, substrate, to a temperature of about 70° C. ±10° C., for a minimum of about 5 minutes and a maximum of about 15 minutes, until the encapsulant precursor 126, has transformed into a gel, (d) heating the encapsulant gel 126, for a minimum of about 1 hour and a maximum of about 2 hours, at a temperature of about 70° C., ±10° C., (e) the encapsulant gel 126, is then hardening at a temperature of between about 130° C., ±10° C., and about 160° C., ±10° C., for a minimum of about 4 hours and a maximum of about 6 hours, (f) the hardened encapsulant 126, is then removed from the oven or furnace and is allowed to cool down to room temperature.

It has been discovered that for some applications it is prudent to directly join the heat sink 10, to the upper or exposed surface of the chip 20, as shown in FIG. 4. Various methods have been tried in the past but it has now been found that a double-sided, pressure-sensitive, thermally conductive adhesive tape 42, having adhesive 41 and 43, provides the best thermal path from the chip 20, to the heat sink 10. This tape 42, also provides reworkability, as the heat sink 10, can be easily removed for rework or repair.

Normally, after one surface of the chip 20, has been properly secured to the substrate 30, the adhesive side 41, of the double-sided, thermally conductive, adhesive tape 42, is secured to the back-side or the non-solder ball side of the chip 20. This could be done manually or by using a suitable machine. The heat sink 10, is then made to contact the adhesive 43, of the double-sided, thermally conductive, pressure-sensitive adhesive tape 42, and is secured thereto. For most applications the heat sink 10, will hang over the edges of the chip 20, i.e., the outer edge portions of the heat sink 10, extend beyond the outer edge portions of the chip 20. Care should be taken that the heat sink 10, does not interfere with other electronic components that may be on or near the substrate 30.

As can be clearly seen in FIG. 4, that with the elimination of the cap 14, thermally conductive material 16, cap sealant 18, and heat sink adhesive 12, a tremendous amount of gain has been made in the MLC packaging art. The same chip 20, which is protected by the encapsulant 126, is now more closer to the heat sink or heat radiator 10, and so now the chip 20, will cool faster and more efficiently. Additionally, more real estate is now available on the surface of the substrate 30, for the placement of more or bigger electronic components.

The simplified electronic package of this invention will replace the existing cap/seal/thermal compound encapsulation system. The preferred encapsulant 126, that is used to encapsulate at least a portion of the solder columns or balls 22, and pads 24, is an EPX5341 encapsulant. EPX5341, is a Trademark of IBM Corporation, Armonk, N.Y., U.S.A. The EPX5341 encapsulant primarily serves two purposes. The first is that it improves the solder ball or solder column's fatigue reliability and secondly it provides an effective barrier against environmental and process exposures.

Figure 5:
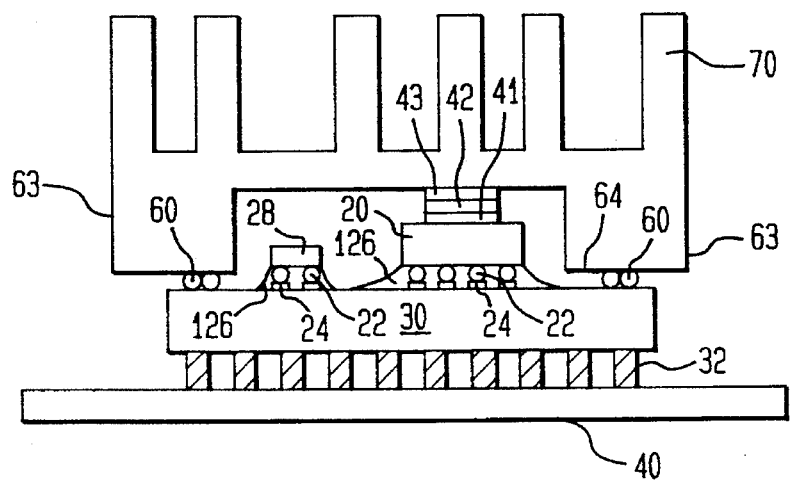
FIG. 5, illustrates yet another preferred embodiment of this invention.

FIG. 5, illustrates yet another preferred embodiment of this invention, where the heat sink 70, has an extension 63. The extension 63, has a base 64, which is substantially flat. The extension 63, should be such that the heat sink 70, completely envelopes the electronic components that are on the surface of the substrate 30, such as the chip 20, or the decoupling capacitor 28. Furthermore, the extension 63, should have sufficient space to accommodate the double-sided, thermally-conductive adhesive tape 42, i.e., that at least a portion of the adhesive 43, makes contact with a portion of the heat sink 70, while at least a portion of the adhesive 41, makes contact with at least a portion of the upper surface of the chip 20. At least one adhesive 60, such as a acrylic dot or paste 60, or an epoxy or a suitable polymer 60, is either applied to the peripheral surface of the substrate 30, or to the base 64, and then using this adhesive acrylic dot or paste 60, the heat sink 70, is secured preferably to the peripheral edge surface of the substrate 30. One suitable acrylic 60, that could be used is LOCTITE OUTPUT 384, which is a Trademark of Loctite Corp., Newington, Conn., USA. If sufficient amount of the adhesive 60, is applied to secure the heat sink 70, to the substrate 30, then this could also provide some environmental protection to the electronic components and other features that are on the surface of the substrate 30, and enveloped by the heat sink 70.

Figure 6:
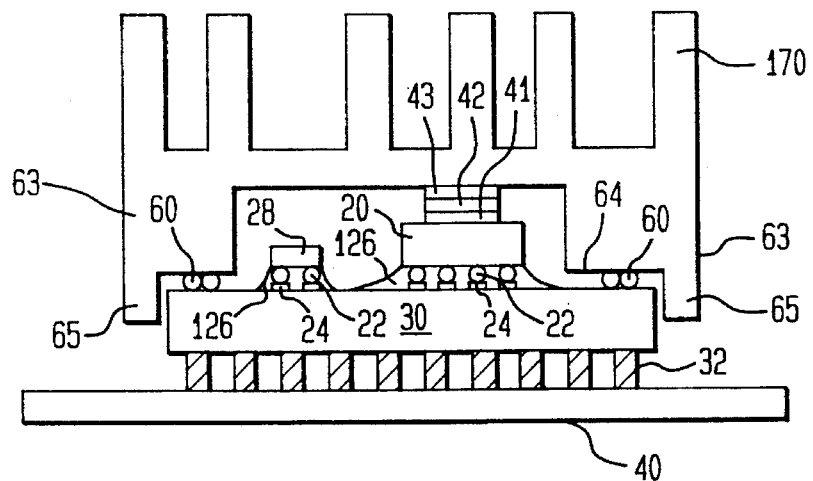
FIG. 6, illustrates still yet another preferred embodiment of this invention.

FIG. 6, illustrates still yet another preferred embodiment of this invention. Heat Sink 170, has a lip or tab 65, that extends at the peripheral edges of the extension 63, and also extends along at least a portion of the peripheral edges of the substrate 30. The lip 65, protects the heat sink 170, from being knocked-off the substrate 30.

The bond integrity between the heat sink 170, and the chip 20, made by the pressure-sensitive adhesive tape 42, is ensured by the adhesive bond 60. Furthermore, the tab 65, that closely fits the peripheral edges of the substrate 30, thus prevents rocking or torquing or other movement of the heat sink 70, under load.

The advantages of an electronic package or module such as the one disclosed in this patent application are many. Such as, the cost of the package is reduced due to (a) fewer process steps to assemble the module, (b) the elimination of the cap, cap seal, thermal compound and related steps, (c) the elimination of yield loss associated with cap misalignment and cap seal leak, etc.

Furthermore, this inventive structure provides a more efficient use of the substrate top surface area, because now nearly 100% of the substrate top surface area is available for electronic components and other features. Additionally, the overall module height is reduced between about 30% to about 50%, because of the deletion of the cap, which allows more room for a cooling device or allows the system designer to reduce the card pitch. This packaging scheme also allows for direct heat sink attach to the chip, thus eliminating the thermal compound and improving the thermal performance of the module.

The polymeric encapsulant 126, has been able to survive the rigors of thermal processing as well as field environmental stress. Therefore, for most applications one could use the polymeric material 126, as both a fatigue enhancement and an environmental protectant.

The structure and process of this invention offers several advantages over the prior art. For example, it reduces the number of materials and process steps required for chip carrier assembly, resulting in lower cost. It also, provides a chip carrier which is able to withstand more severe environments, particularly process solvent exposures.

Another advantage of using a double-sided, thermally-conductive adhesive tape is the reworkability or repair of the module. The heat sink can be easily pulled-off from the substrate or the chip and the active devices, such as, a chip or passive devices, such as, a decoupling capacitor, heat sink, etc., could be reworked or repaired. Furthermore, any circuits on the surface of the substrate could also be reworked or repaired after the heat sink has been removed. Of course the heat sink can be reattached once the rework or repairs have been made.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for forming a chip carrier having a single encapsulant, comprising:
   (a) electrically connecting at least one chip to a first surface of a substrate, and forming an electrical connection between said at least one chip and said substrate,
   (b) applying an encapsulant precursor to at least a portion of said electrical connection and to at least a portion of said first surface of said substrate,
   (c) heating said encapsulant precursor to a temperature of about 70° C., ±10° C., for a minimum of of about 5 minutes and a maximum of about 15 minutes, until said encapsulant precursor has transformed into a gel,
   (d) heating said encapsulant gel for a minimum of about 1 hour and a maximum of about 2 hours, at a temperature of about 70° C., ±10 ° C.,
   (e) hardening said encapsulant gel at a temperature of between about 130° C., ±10° C., and about 160° C., ±10° C., for a minimum of about 4 hours and a maximum of about 6 hours,
   (f) cooling said hardened encapsulant until said hardened encapsulant has reached room temperature, and thereby forming said chip carrier having a single encapsulant.

2. The method of claim 1, wherein said encapsulant precursor comprises of a mixture of cycloaliphatic epoxide, hexahydrophthalic anhydride, benzyl dimethyl amine, silica filler and ethylene glycol.

3. The method of claim 1, wherein said first surface of said substrate has electrical circuitry.

4. The method of claim 3, wherein at least a portion of said electrical circuitry is encapsulated with said encapsulant.

5. The method of claim 1, wherein a heat sink is secured to at least one of said chip.

6. The method of claim 5, wherein said heat sink is secured to said chip via a method selected from a group comprising, using acrylic material, a double-sided thermally-conductive pressure-sensitive adhesive tape, an epoxy or a polymeric material.

7. The method of claim 1, wherein a heat sink is secured to said chip carrier.

8. The method of claim 7, wherein said heat sink is secured to said chip carrier via a method selected from a group comprising, using acrylic material, a double-sided thermally-conductive pressure-sensitive adhesive tape, an epoxy or a polymeric material.

9. The method of claim 1, wherein said electrical connection is selected from a group comprising solder ball, solder column, low-melting point solder or high-melting point solder.

10. The method of claim 1, wherein said substrate has at least one additional electronic device secured thereto.

11. The method of claim 10, wherein said at least one additional electronic device is a decoupling capacitor.

12. The method of claim 1, wherein said substrate is itself secured to a card using at least one second electrical connection.

13. The method of claim 12, wherein said second electrical connection is selected from a group comprising solder ball, solder column, low-melting point solder, high-melting point solder, pad or clip.

14. The method of claim 5, wherein at least a portion said heat sink has an extension and wherein at least a portion of said extension is secured to said substrate.

15. The method of claim 14, wherein said extension has a lip that extends beyond the peripheral edges of said substrate.

16. The method of claim 14, wherein said extension has a base and wherein at least a portion of said base is secured to at least a portion of the peripheral edges of said substrate with an adhesive.

17. The method of claim 16, wherein the material for said adhesive is selected from a group comprising acrylic, epoxy or polymeric material.

* * * * *